(12) United States Patent
Shin

(10) Patent No.: US 7,791,699 B2
(45) Date of Patent: Sep. 7, 2010

(54) THIN FILM TRANSISTOR ARRAY PANEL WITH DIRECTIONAL CONTROL ELECTRODE AND LIQUID CRYSTAL DISPLAY INCLUDING THE SAME

(75) Inventor: Kyoung-Ju Shin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 785 days.

(21) Appl. No.: 11/454,261

(22) Filed: Jun. 16, 2006

(65) Prior Publication Data

US 2006/0285028 A1    Dec. 21, 2006

(30) Foreign Application Priority Data

Jun. 20, 2005    (KR)    ..................... 10-2005-0052954

(51) Int. Cl.
*G02F 1/1343*    (2006.01)
*G02F 1/1337*    (2006.01)

(52) U.S. Cl. ........................ 349/144; 349/141; 349/142; 349/143; 349/191; 349/123; 349/128; 349/129

(58) Field of Classification Search ......... 349/123–130, 349/141–144, 132, 191; 345/103
See application file for complete search history.

(56) References Cited

U.S. PATENT DOCUMENTS

| | | | |
|---|---|---|---|
| 6,081,315 A * | 6/2000 | Matsuyama et al. | 349/143 |
| 6,407,791 B1 * | 6/2002 | Suzuki et al. | 349/129 |
| 6,456,352 B1 * | 9/2002 | Matsuyama et al. | 349/143 |
| 7,215,386 B2 * | 5/2007 | Hong et al. | 349/43 |
| 7,253,849 B2 * | 8/2007 | Shin et al. | 349/43 |
| 7,333,171 B2 * | 2/2008 | Kim et al. | 349/144 |

\* cited by examiner

*Primary Examiner*—Hoan C Nguyen
(74) *Attorney, Agent, or Firm*—Innovation Counsel LLP

(57) ABSTRACT

The present invention provides a VA mode LCD having a wide viewing angle without forming cutouts or protrusions in the common electrode. A thin film transistor drives a pixel electrode having a cutout and a direction control electrode connected to the thin film transistor overlaps the pixel electrode's cutout. A coupling electrode is connected to the direction control electrode overlapping the pixel electrode allowing the direction control electrode voltage to be maintained higher than the pixel electrode voltage.

16 Claims, 5 Drawing Sheets

THIN FILM TRANSISTOR ARRAY PANEL WITH DIRECTIONAL CONTROL ELECTRODE AND LIQUID CRYSTAL DISPLAY INCLUDING THE SAME

REFERENCE TO RELATED APPLICATION

This application claims priority and benefit of Korean Patent Application No. 10-2005-0052954 filed in the Korean Intellectual Property Office on Jun. 20, 2005, the contents of which are incorporated herein by reference.

FIELD OF THE INVENTION

The present invention relates to a thin film transistor (TFT) array panel for a liquid crystal display.

DESCRIPTION OF THE RELATED ART

A liquid crystal display (LCD) generally includes an upper panel provided with a common electrode and color filters, a lower panel provided with thin film transistors (TFTs) and pixel electrodes, and a liquid crystal (LC) layer interposed therebetween. The pixel electrodes and the common electrode are supplied with different voltages to generate an electric field in the LC layer that determine the orientations of the LC molecules. Hereinafter, the pixel electrode 191 and the common electrode 270 may be referred to as electric field generating electrodes. Since the orientation of the LC molecules determines the transmittance of incident light, the LCD can display desired images by adjusting the voltage differences between the two electrodes. Among the LCDs, the vertical alignment (VA) LCD, which aligns LC molecules such that long axes of the LC molecules are perpendicular to the panels in the absence of an electric field, is important because of its high contrast ratio and wide reference viewing angle. Reference viewing angle is defined as the viewing angle at which the contrast ratio is equal to 1:10 or as the limit angle for the inversion in luminance between the grays. The wide viewing angle of the VA mode LCD can be realized by using cutouts and protrusions in the field-generating electrodes. The cutouts and the protrusions determine the tilt directions of the LC molecules. By disposing the cutouts and the protrusions in various ways the tilt directions can be distributed in several directions such that the reference viewing angle is widened.

However, to form the cutouts in both the pixel electrodes and the common electrode, an additional mask is required for patterning the common electrode. Also, an overcoat is required on the color filters for preventing contamination of the LC layer by leakage of the pigments used in the color filters through the cutouts in the common electrode. The manufacturing of the LCD is complicated because of the additional process step for forming the protrusions. Moreover, the VA mode LCD having protrusions or cutouts has a problem in that the response speed of the display device is slowed since the LC molecules far from the protrusions or cutouts are under weak control while the LC molecules near the protrusions or cutouts are strongly controlled.

SUMMARY OF THE INVENTION

To solve the above mentioned problems, an embodiment of the present invention provides an LCD having a wide viewing angle without forming cutouts or protrusions in the common electrode. A thin film transistor drives a pixel electrode having a cutout and a direction control electrode connected to the thin film transistor overlaps the pixel electrode's cutout. A coupling electrode is connected to the direction control electrode overlapping the pixel electrode. The voltage applied to the direction control electrode is preferably higher than the voltage of the pixel electrode whose voltage may be less than half or one-third the voltage of the direction control electrode. Since the voltage of the direction control electrode is higher than the voltage of the pixel electrode, the horizontal component of a subordinate electric field is stronger and in the opposite direction to the horizontal component of the primary electric field so the pure horizontal component of the electric field at the cutout where the direction control electrode is located is in the same direction as the horizontal component at the edge of the adjacent pixel electrode.

BRIEF DESCRIPTION OF THE DRAWINGS

The foregoing and other objects and features of the present invention may become more apparent from a reading of the ensuing specification together with the drawing, in which.

DETAILED DESCRIPTION

Figure 1:
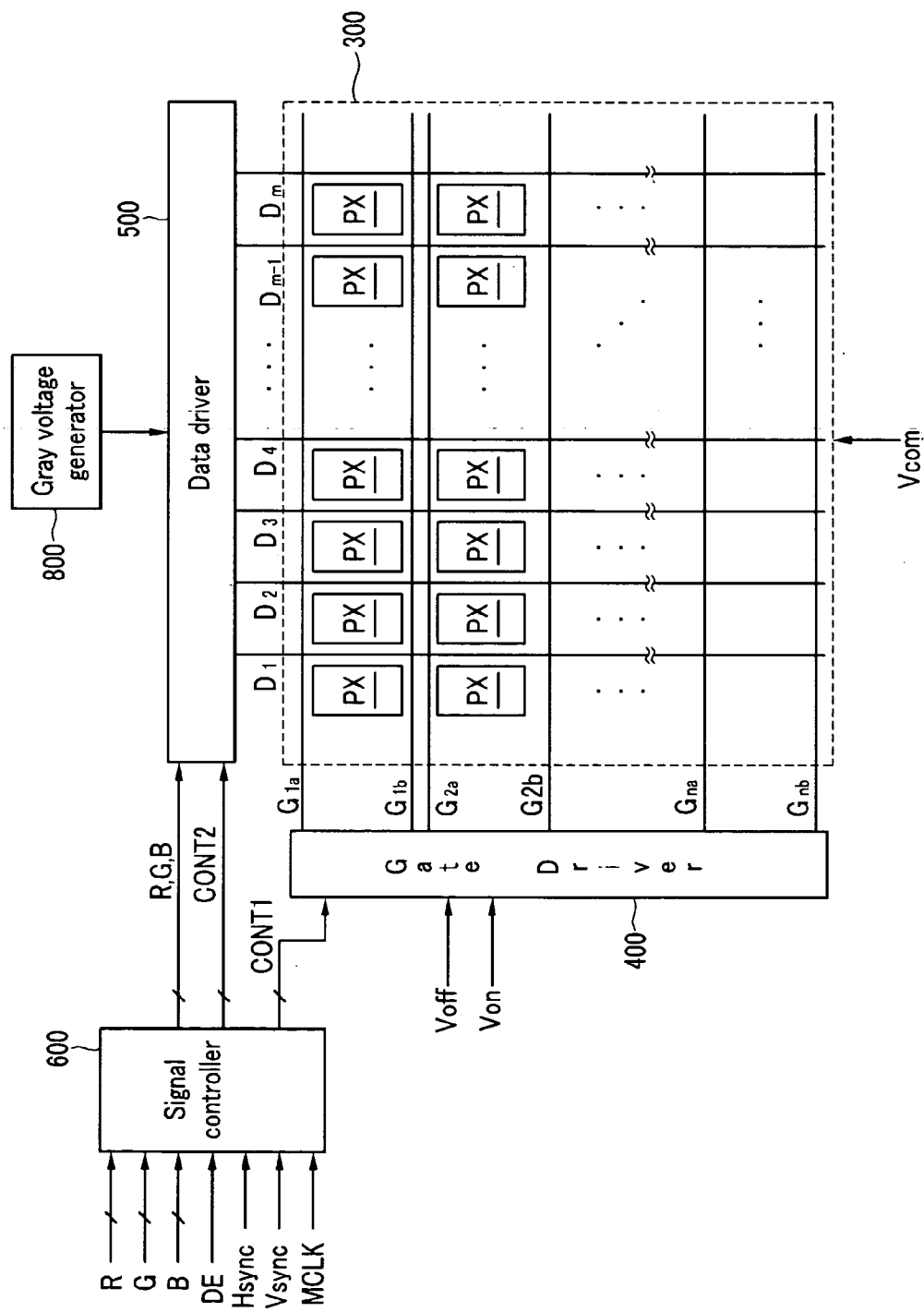
FIG. 1 is a block diagram of an LCD according to an embodiment of the present invention.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
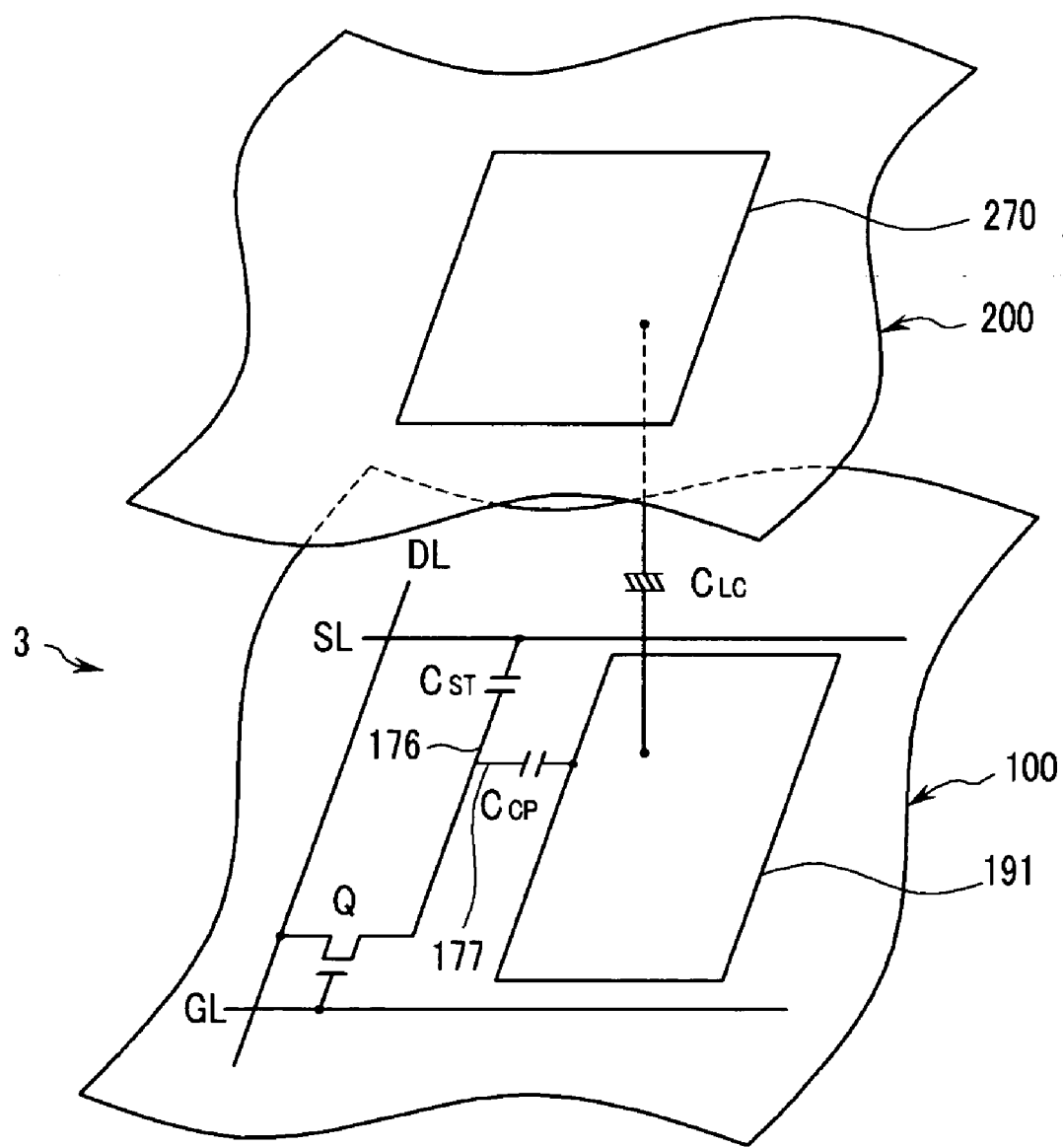
FIG. 2 is an equivalent circuit diagram of a pixel of an LCD according to an embodiment of the present invention.

FIG. 1 is a block diagram of an LCD according to an embodiment of the present invention, and FIG. 2 is an equivalent circuit diagram of a pixel of an LCD according to an embodiment of the present invention. Referring to FIGS. 1 and 2, the LCD according to an embodiment of the present invention includes a liquid crystal panel assembly 300, a gate driver 400 and a data driver 500 that are connected to the liquid crystal panel assembly 300, a gray voltage generator 800 connected to the data driver 500, and a signal controller 600 for controlling the above elements.

The liquid crystal panel assembly 300 includes a plurality of display signal lines $G_1$-$G_n$ and $D_1$-$D_m$, and a plurality of pixels connected thereto and arranged approximately in a matrix, as seen in the equivalent circuit diagram. Liquid crystal panel assembly 300 also includes lower and upper panels 100 and 200 that face each other with a liquid crystal layer 3 interposed therebetween, as seen in FIG. 2. Display signal lines $G_1$-$G_n$ and $D_1$-$D_m$ include a plurality of gate lines $G_1$-$G_n$ for transmitting gate signals (also referred to as "scanning signals") and a plurality of data lines $D_1$-$D_m$ for transmitting data signals. Gate lines $G_1$-$G_n$ extend substantially in a row direction and are substantially parallel to each other, and data lines $D_1$-$D_m$ extend substantially in a column direction and are substantially parallel to each other.

Each pixel PX, for example the pixel PX connected to the i-th (i=1, 2, . . . , n) gate line $G_i$ and the j-th (j=1, 2, . . . , m) data line $D_j$, includes a switching element Q connected to the signal lines $G_i$ and $D_j$, a coupling capacitor Ccp connected to the switching element Q, a liquid crystal capacitor $C_{LC}$, and a storage capacitor $C_{ST}$ that is connected to the coupling capacitor Ccp. If it is unnecessary, the storage capacitor $C_{ST}$ may be omitted. Switching element Q, such as a TFT, is a three-terminal element provided on the lower panel 100. The control terminal of element Q is connected to gate line GL, the input terminal is connected to data line DL, and the output terminal is connected to coupling capacitor Ccp and the storage capacitor $C_{ST}$.

The liquid crystal capacitor $C_{LC}$ includes a pixel electrode 191 provided on the lower panel 100 and a common electrode 270 provided on the upper panel 200. LC layer 3 is disposed between the two electrodes 191 and 270 and functions as a dielectric. Pixel electrode 191 is connected to direction control electrode 176 via coupling capacitor Ccp, and common electrode 270 is formed on the entire surface of the upper panel 200 and is supplied with a common voltage Vcom. Unlike FIG. 2, common electrode 270 may be alternately provided on the lower panel 100, when at least one of the two electrodes 191 and 270 has the shape of a stripe or a bar.

Storage capacitor $C_{ST}$ functions as an auxiliary capacitor for LC capacitor $C_{LC}$ and is formed by overlapping the storage electrode line SL provided on the lower panel 100 with the direction control electrode 176, an insulator being disposed between them. Storage electrode line SL is supplied with a predetermined voltage such as the common voltage Vcom. Alternatively, the storage capacitor $C_{ST}$ may be formed by overlapping the direction control electrode 176 with an adjacent gate line over an insulator.

Coupling capacitor Ccp is interposed between the direction control electrode 176 and the pixel electrode 191 and is connected to the direction control electrode 176 and the pixel electrode 191. Coupling capacitor Ccp includes a coupling electrode 177 as a terminal, a pixel electrode 191 as another terminal, and an insulating layer therebetween as a dielectric.

In order to implement color display, each pixel PX uniquely displays one of the primary colors (spatial division) or each pixel PX sequentially displays the primary colors in turn (temporal division) such that the spatial or temporal sum of the primary colors is recognized as a desired color. An examplary set of the primary colors includes red, green, and blue colors. FIG. 2 shows an example of the spatial division in which each pixel includes a color filter 230 representing one of the primary colors in an area of the upper panel 200 facing the pixel electrode 191. Unlike FIG. 2, the color filter 230 may alternately be provided on or under the pixel electrode 191 on the lower panel 100.

Figure 3:
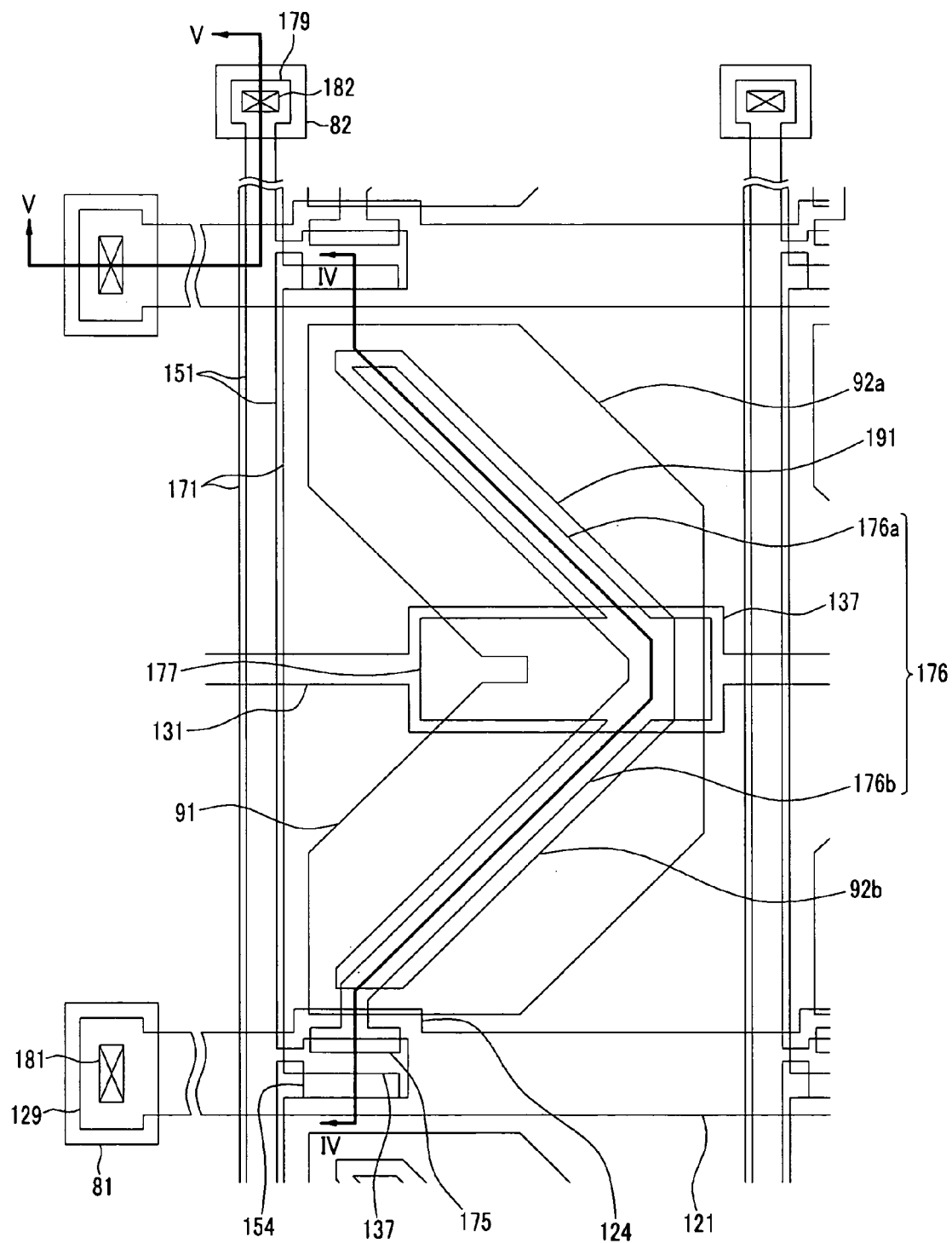
FIG. 3 is a layout view of an LCD according to an embodiment of the present invention.
Figure 4:
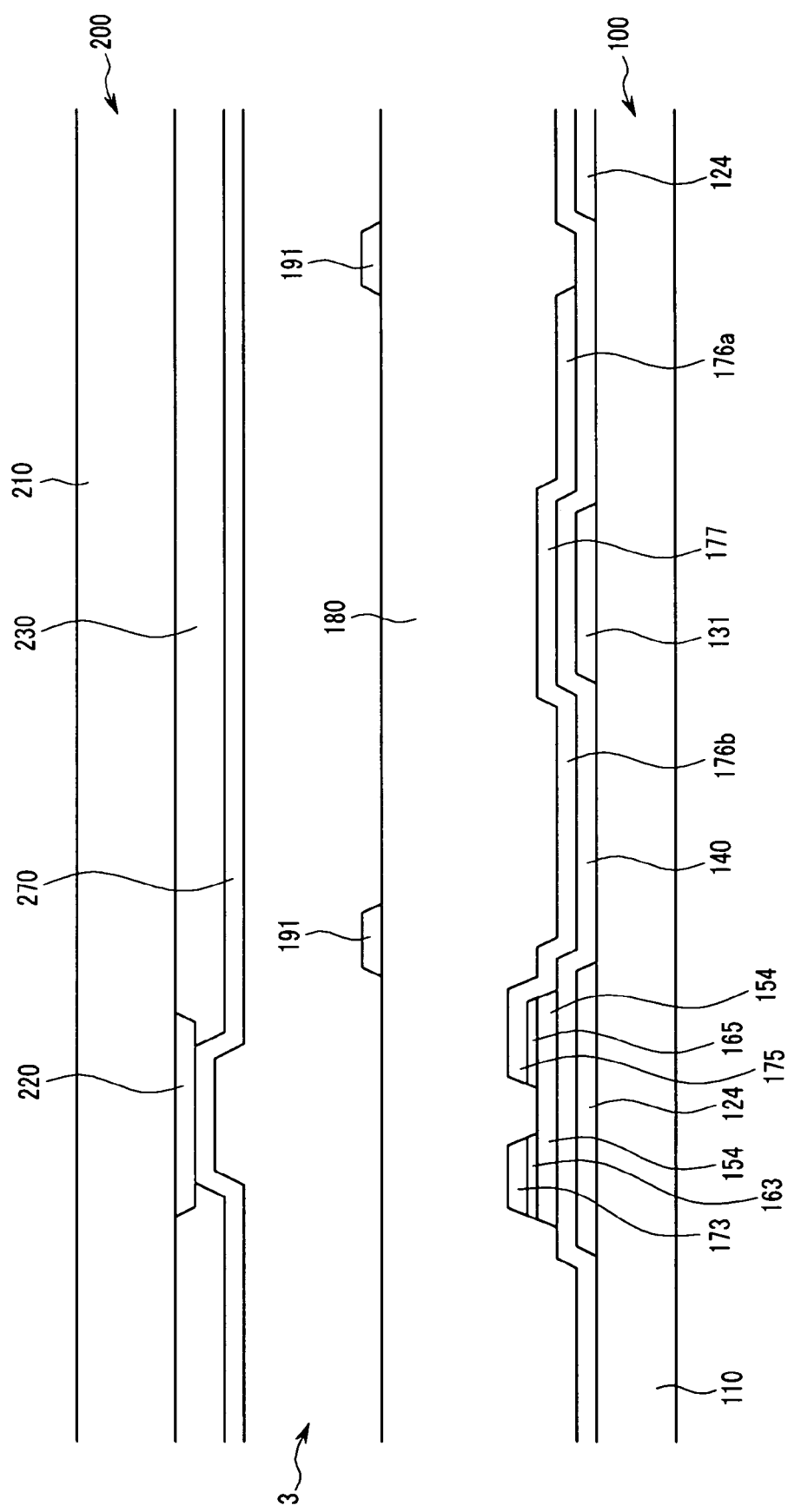
FIGS. 4 and 5 are sectional views of the LCD shown in FIG. 3 taken along the line IV-IV and the line V-V, respectively.
Figure 5:
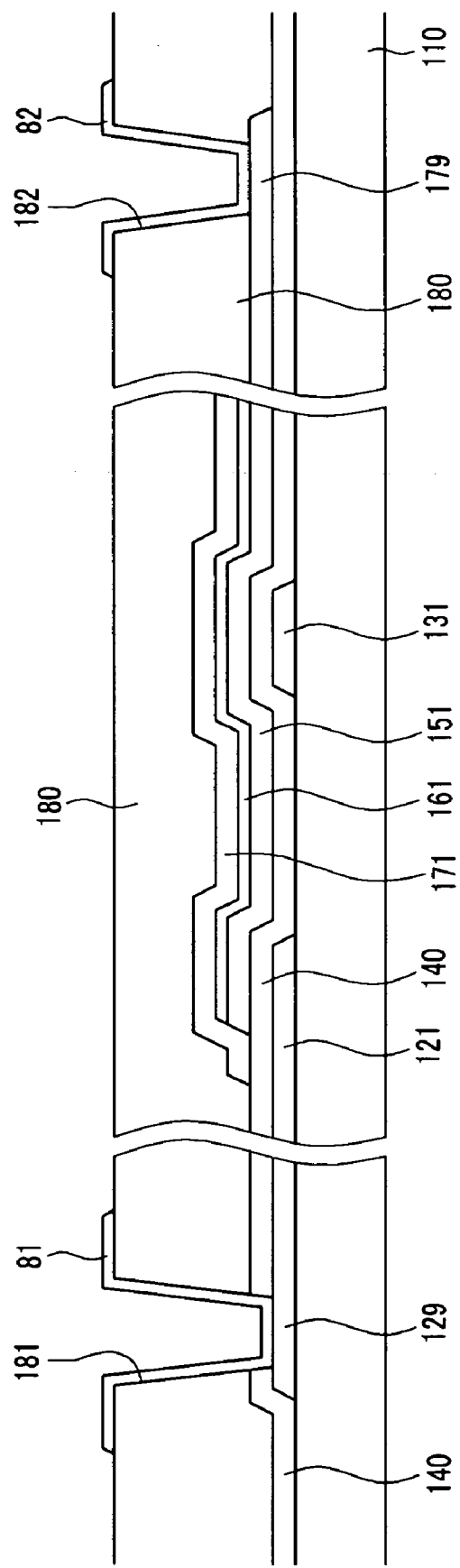

Liquid crystal panel assembly 300 mentioned above will now be described in detail with reference to FIGS. 3 to 5. FIG. 3 is a layout view of an LCD according to an embodiment of the present invention, and FIGS. 4 and 5 are sectional views of the LCD shown in FIG. 3 taken along the line IV-IV and the line V-V, respectively. Referring to FIGS. 3 to 5, the liquid crystal panel assembly according to an embodiment of the present invention includes a thin film transistor array panel 100, a common electrode panel 200, and a LC layer 3 interposed therebetween. A plurality of gate lines 121 and a plurality of storage electrode lines 131 are formed on an insulating substrate 110 that is preferably made of transparent glass or plastic. Gate lines 121 extend in a substantially transverse direction. Each of gate lines 121 includes a plurality of gate electrodes 124 that protrude upward and an end portion 129 having a large area for connection with another layer or a gate driver 400.

Storage electrode lines 131 are supplied with a predetermined voltage and extend nearly parallel to the gate line 121. Each of the storage electrode lines 131 is disposed substantially equidistant between two adjacent gate lines 121. Storage electrode lines 131 include storage electrodes 137 that extend upward and downward. However, the shape and disposition of the storage electrode lines 131 may be variously changed.

Gate lines 121 and storage electrode lines 131 are preferably made of an Al-containing metal such as Al and an Al alloy, a Ag-containing metal such as Ag and a Ag alloy, a Cu-containing metal such as Cu and a Cu alloy, a Mo-containing metal such as Mo and a Mo alloy, Cr, Ta, and Ti. However, gate lines 121 and storage electrode lines 131a and 131b may have a multi-layered structure including two conductive films (not shown) having different physical characteristics. One of the two conductive films is preferably made of a low resistivity metal such as an Al-containing metal, a Ag-containing metal, or a Cu-containing metal for reducing signal delay or voltage drop. On the other hand, the other conductive film is preferably made of a material such as a Mo-containing metal, Cr, Ti, and Ta, which has good physical, chemical, and electrical contact characteristics with other materials such as indium tin oxide (ITO) or indium zinc oxide (IZO). Good exemplary combinations of the two film materials are a pair of a lower Cr film and an upper Al (alloy) film and a pair of a lower Al (alloy) film and an upper Mo (alloy) film. However, the gate lines 121 and the storage electrode lines 131 may be made of many various metals or conductive materials besides the above. The lateral sides of the gate lines 121 and the storage electrode lines 131 are inclined relative to a surface of the substrate 110, and the preferable inclination angle thereof ranges from about 30° to about 80°.

Gate insulating layer 140 is preferably made of silicon nitride (SiNx) or silicon oxide (SiOx) is formed on the gate lines 121 and the storage electrode lines 131. A plurality of semiconductor stripes 151, preferably made of hydrogenated amorphous silicon (abbreviated as "a-Si") or polysilicon, are formed on gate insulating layer 140. Each semiconductor stripe 151 extends substantially in the longitudinal direction and has a plurality of projections 154 branched out toward gate electrodes 124.

A plurality of ohmic contact stripes 161 and islands 165 are formed on semiconductor stripes 151. Ohmic contacts 161 and 165 may be made of a material such as n+ hydrogenated a-Si heavily doped with an n-type impurity such as phosphorus (P) or silicide. Each ohmic contact stripe 161 has a plurality of projections 163, and projections 163 and ohmic contact islands 165 are located in pairs on projections 154 of the semiconductor stripes 151. The lateral sides of semiconductors 151 and 154 and ohmic contacts 161 and 165 are inclined relative to a surface of the substrate 110, and the preferable inclination angle ranges from about 30° to about 80°.

A plurality of data lines 171 and a plurality of drain electrodes 175 are formed on the ohmic contacts 161 and 165 and the gate insulating layer 140. Data lines 171 for transmitting data signals extend substantially in the longitudinal direction and intersect gate lines 121. Each data line 171 includes a plurality of source electrodes 173 branched out toward the gate electrodes 124 and an end portion having a large area for connection with another layer or a data driver 500. Each drain electrode 175 is separated from data line 171 and opposes source electrode 173 with respect to gate electrode 124. A gate electrode 124, a source electrode 173, and a drain electrode 175, along with projection 154 of semiconductor stripe 151, form a TFT having a channel between the source electrode 173 and the drain electrode 175.

Drain electrode 175 includes an end portion located on projection 154 of semiconductor 151, a direction control electrode 176 connected to the end portion, and a coupling electrode 177 connected to the direction control electrode 176. Direction control electrode 176 includes a lower direction control electrode 176b that extends obliquely in the right and upper direction from a drain electrode 175 and meets storage electrode line 131, and a upper direction control electrode 176a that turns in the left and upper direction from the storage electrode line 131 and extends to the vicinity of the previous gate line 121.

Direction control electrode 176 forms a storage capacitor $C_{ST}$ along with a storage electrode 137. Coupling electrode 177 protrudes and expands in the direction toward storage electrode line 131 from direction control electrode 176 near storage electrode line 131. Coupling electrode 177 forms a storage capacitor $C_{ST}$ by overlapping storage electrode 137.

Data lines 171 and drain electrodes 175 are preferably made of a refractory metal such as Mo, Cr, Ta, and Ti or an alloy thereof. Also, data lines 171 and drain electrodes 175 may have a multi-layered structure including a refractory metal film (not shown) and a conductive film (not shown) having low resistivity. An example of the multi-layered structure includes double layers of a lower Cr or Mo (alloy) film and an upper Al (alloy) film, and triple layers of a lower Mo (alloy) film, an intermediate Al (alloy) film, and an upper Mo (alloy) film. However, the data lines 171 and the drain electrodes 175 may be made of many various metals or conductive materials besides the above. The lateral sides of the data lines 171 and the drain electrodes 175 are also inclined relative to a surface of the substrate 110, and the inclination angles thereof are preferably in a range of about 30° to about 80°.

Ohmic contacts 161 and 165 are interposed only between the underlying semiconductors 151 and 154 and the overlying data lines 171 and drain electrodes 175 to reduce contact resistance. Semiconductors 151 and 154 include exposed portions that are not covered with the data lines 171 and the drain electrodes 175 such as portions located between the source electrodes 173 and the drain electrodes 175.

A passivation layer 180 is formed on the data lines 171, the drain electrodes 175, and the exposed portions of the semiconductor stripes 151. The passivation layer 180 is preferably made of an inorganic insulator or an organic insulator, and the surface thereof may be flat. Examples of the inorganic insulator include silicon nitride and silicon oxide. The organic insulator may have photosensitivity and the preferable dielectric constant thereof is lower than about 4.0. However, the passivation layer 180 may have a double-layered structure including a lower inorganic film and an upper organic film in order to protect the exposed portions of the semiconductor stripes 151 and to benefit from the substantial insulating property of an organic film. Passivation layer 180 has a plurality of contact holes 182 exposing the end portions 179 of data lines 171 and drain electrodes 175, respectively. Passivation layer 180 and gate insulating layer 140 have a plurality of contact holes 181 exposing end portions 129 of the gate lines 121. A plurality of pixel electrodes 191 and a plurality of contact assistants 81 and 82 are formed on the passivation layer 180. A pixel electrode 191 forms a coupling capacitor Ccp by overlapping a coupling electrode 177, and by overlapping the storage capacitor $C_{ST}$ with the coupling capacitor Ccp, there is an advantage with respect to the aperture ratio.

Pixel electrodes 191 generate electric fields in cooperation with common electrode 270 on the common electrode panel 200 that is supplied with a common voltage so that orientations of the liquid crystal molecules in the liquid crystal layer 3 interposed between the two electrodes are determined. In accordance with the determined orientations of the liquid crystal molecules, the polarization of light passing through the liquid crystal layer is varied. Pixel electrode 191 and common electrode 270 form a liquid crystal capacitor $C_{LC}$ to store applied voltages even after the TFT is turned off. Each pixel electrode 191 has chamfered right corners, and the chamfered oblique edges of the pixel electrode 191 make an angle of about 45° with the gate lines 121. Each pixel electrode 191 has first and second cutouts 91 and 92a, 92b. The first cutout 91 extends shortly along the gate line 121 and has an inlet toward the left edge. The inlet of the first cutout 91 has a pair of oblique edges that are parallel to the direction control electrode 176. The second cutout 92a, 92b extends along the direction control electrode 176 and exposes the entire direction control electrode 176.

First and second cutouts 91 and 92a, 92b have approximate inversion symmetry with respect to the storage electrode line 131 that is located to bisect the pixel electrodes 191. Therefore, the lower half of the pixel electrode 191 is partitioned into two partitions by the second cutout 92a, and the upper half of the pixel electrode 191 is also partitioned into two partitions by the second cutout 92b. Here, the number of partitions or the number of cutouts is varied depending on design factors such as the size of the pixel electrodes 191, the ratio of the transverse edges and the longitudinal edges of the pixel electrodes 191, the type and characteristics of the liquid crystal layer 3, and so on. However, in the case of many cutouts, it is preferable to dispose cutouts that overlap the direction control electrodes 176 and cutouts that don't overlap the direction control electrodes 176 alternately.

Contact assistants 81 and 82 are connected to the end portion 129 of the gate line 121 and the end portion 179 of the data line 171 through the contact holes 181 and 182, respectively. Contact assistants 81 and 82 supplement the adhesive property of the end portions 129 of the gate lines 121 and the end portions 179 of the data lines 171 to exterior devices, and protect them.

Next, the color filter array panel 200 is described. A light blocking member 220 is formed on a substrate 210. Light blocking member 220 is also called a black matrix, and it defines a plurality of opening areas opposed to the pixel electrodes 191 and also prevents the leakage of light between the pixel electrodes 191. A plurality of color filters 230 are also formed on the substrate 210 and disposed substantially in the opening areas surrounded by the light blocking member 220. Color filters 230 may extend in the longitudinal direction along the pixel electrodes 191 to form a stripe. Each color filter 230 may represent one of three primary colors such as red, green, and blue colors. Common electrode 270 is formed on color filters 230 and light blocking member 220. Since cutouts are not needed on the common electrode 270, common electrode 270 has a continuous surface. In addition, no protrusion is needed on common electrode 270. Common electrode 270 is preferably made of a transparent conductive material such as ITO or IZO. An alignment layer (not shown) for alignment of the liquid crystal layer 3 is coated on inner surfaces of the panels 100 and 200, and one or more polarizers (not shown) are provided on outer surfaces of the panels 100 and 200.

Referring to FIG. 1 again, gray voltage generator 800 generates two sets of a plurality of gray voltages (or reference gray voltages) related to the transmittance of the pixels PX. The gray voltages in one set have a positive polarity with respect to the common voltage Vcom, while those in the other set have a negative polarity with respect to the common voltage Vcom.

Gate driver 400 is connected to the gate lines $G_1$-$G_n$ of the liquid crystal panel assembly 300 and synthesizes the gate-on voltage Von and the gate-off voltage Voff to generate gate signals, which are applied to the gate lines $G_1$-$G_n$. Data driver 500 is connected to data lines $D_1$-$D_m$ of liquid crystal panel assembly 300 and applies data voltages, which are selected from the gray voltages supplied from gray voltage generator 800, to data lines $D_1$-$D_m$. However, when the gray voltage generator 800 doesn't supply the voltages for all grays, but supplies only a predetermined number of the reference gray voltages, data driver 500 divides the reference gray voltages to generate gray voltages for all grays from which data signals are selected.

Signal controller 600 controls the gate driver 400 and the data driver 500. Each of the drivers 400, 500, 600, and 800 mentioned above may be directly mounted on the liquid crystal panel assembly 300 in the form of at least one integrated circuit (IC) chip, or may be mounted on a flexible printed circuit film (not shown) to be attached to the liquid crystal panel assembly 300 in a tape carrier package (TCP) form, or may be mounted on a separate printed circuit board (not shown). On the other hand, the drivers 400, 500, 600, and 800 may be integrated with the liquid crystal panel assembly 300 along with the signal lines $G_1$-$G_n$, $D_1$-$D_m$, and SL and the TFT switching elements Q. Also, the drivers 400, 500, 600, and 800 may be integrated into a single chip, and at least one thereof or at least one circuit element forming them may be located outside of the single chip.

Next, the operation of the liquid crystal display mentioned above will be described in detail. Signal controller 600 receives input image signals R, G, and B and input control signals for controlling the display of the image signals from an external graphics controller (not shown). An example of the input control signals includes a vertical synchronization signal Vsync, a horizontal synchronization signal Hsync, a main clock signal MCLK, and a data enable signal DE. Signal controller 600 processes the input image signals R, G, and B suitably for the operation condition of the liquid crystal panel assembly 300 on the basis of the input image signals R, G, and B and the input control signals, and generates gate control signals CONT1 and data control signals CONT2. Then, signal controller 600 transmits gate control signals CONT1 to the gate driver 400, and data control signals CONT2 and the processed image signals DAT to the data driver 500. Gate control signals CONT1 include a scanning start signal STV to start the scanning and at least one clock signal for controlling the output time of the gate-on voltage Von. Gate control signals CONT1 may further include an output enable signal OE for defining the duration of the gate-on voltage Von. Data control signals CONT2 include a horizontal synchronization start signal STH for informing a start of image data transmission for a row of pixels PX, a load signal LOAD for instructing to apply the data voltages to the data lines $D_1$-$D_m$, and a data clock signal HCLK. Data control signal CONT2 may further include a inversion signal RVS for reversing the polarity of the data signals with respect to the common voltage Vcom (hereinafter, "the polarity of the data signals with respect to the common voltage Vcom" is referred to as "the polarity of the data signals").

In accordance with the data control signals CONT2 from the signal controller 600, data driver 500 sequentially receives digital image signals DAT for a row of pixels PX, selects gray voltages corresponding to the respective digital image signals DAT, converts the digital image signals DAT into analog data signals, and applies the analog data signals to the corresponding data lines $D_1$-$D_m$.

Gate driver 400 sequentially applies the gate-on voltage $V_{on}$ to the gate lines $G_1$-$G_n$ in response to the gate control signals CONT1 from the signal controller 600, thereby turning on the switching elements Q connected to the gate lines $G_1$-$G_n$. Then, the data signals applied to the data lines $D_1$-$D_m$ are applied to the corresponding pixels PX through the turned-on switching elements Q.

In more detail, when gate-on voltage Von is applied to gate line 121, switching element Q is turned on, and a data voltage is applied to the direction control electrode 176. Then, coupling capacitor Ccp including a coupling electrode 177 connected to the direction control electrode 176 and a pixel electrode 191 is charged, thereby charging the pixel electrode 191 with a pixel electrode voltage. The direction control electrode voltage is equal to the data voltage, and the pixel electrode voltage is expressed as:

$$V\text{pix} = V\text{data} \times [Ccp/(C_{LC}+Ccp)] \quad \text{Equation 1}$$

Here, Vpix represents the pixel electrode voltage, Vdata represents the data voltage, and each capacitor Ccp and $C_{LC}$ and their capacitances are denoted as the same reference characters.

Referring to Equation 1, the difference between the direction control electrode voltage Vdce and the pixel electrode voltage Vpix is adjusted by the coupling capacitor Ccp, and the direction control electrode voltage Vdce is always maintained higher than the pixel electrode voltage Vpix. Pixel electrode voltage Vpix is preferably lower than half the direction control electrode voltage Vdce, and preferably one-third to one-half of the direction control electrode voltage Vdce.

When pixel electrode 191 is charged with a voltage, a voltage difference is applied between common electrode 270 and pixel electrode 191, and a primary electric field that is almost perpendicular to the panels 100 and 200 is generated. The LC molecules respond to the electric field so that long axes thereof are rearranged to be vertical to the primary electric field. The cutouts 91 and 92a (92b) and the edges of the pixel electrode 191 distort the electric field to generate a horizontal component for determining the tilt direction of the LC molecules. The horizontal component of the primary electric field is almost perpendicular to the edges of the cutouts 91 and 92a (92b) and the edges of the pixel electrode 191, and the direction thereof is inward or outward in accordance with the polarity of the voltages of the pixel electrode 191. For example, if the voltage of the pixel electrode 191 is higher than the common voltage Vcom, the horizontal component is toward the inside of the pixel electrode 191.

Since there is a voltage difference between direction control electrode 178 and pixel electrode 191, a subordinate electric field is generated according to the voltage difference. The subordinate electric field has a horizontal component that is substantially parallel to the horizontal component of the primary electric field. As described above, since the voltage of the direction control electrode 178 (with respect to the common voltage Vcom) is higher than the voltage of the pixel electrode 191, the horizontal component of the subordinate electric field is in the opposite direction to the horizontal component of the primary electric field and the strength thereof is also stronger than the horizontal component of the primary electric field. Therefore, the pure horizontal component of the electric field at the cutout 92a (92b) where the direction control electrode 178 is located is in the same direction as the horizontal component at the edge of the adjacent pixel electrode 191.

As described above, the second cutout 92a, 92b partitions the pixel electrode 191 into a plurality of partitions, and each partition has two major edges parallel to each other. Since the LC molecules in each partition receive forces of the horizontal components of the electric fields that are substantially perpendicular to the major edges and in the direction as mentioned above, the tilt directions are sorted into about four directions. In this way, the reference viewing angle is widened by varying the tilt directions of the LC molecules. The arrangement of LC molecules varies depending on the size of the pixel electrode voltages, and thus the polarization of light passing through the LC layer 3 varies. As a result, the transmittance of the light is varied by the polarizer attached to the panel assembly 300. By repeating this procedure by a unit of the horizontal period (which is denoted by "1H" and is equal to one period of the horizontal synchronization signal Hsync and the data enable signal DE), all gate lines $G_1$-$G_n$ are sequentially supplied with the gate-on voltage Von during a frame, thereby applying the data signals to all pixels PX to display an image for a frame.

When the next frame starts after finishing one frame, the inversion signal RVS applied to the data driver 500 is controlled such that the polarity of the data signals is reversed (which is referred to as "frame inversion"). Here, even in one frame, the polarity of the data signals flowing in a data line may vary (for example, row inversion or dot inversion), or the polarities of the data signals applied to the pixels in a row may be different from each other (for example, column inversion or dot inversion) in accordance with the characteristics of the inversion signal RVS. As mentioned above, in the present invention, since the direction control electrode voltage can be maintained higher than the pixel electrode voltage, a VA mode LCD with a wide viewing angle can be manufactured without forming cutouts or protrusions in the common electrode.

Although preferred embodiments of the present invention have been described in detail hereinabove, it should be clearly understood that many variations and/or modifications of the basic inventive concepts herein taught, which may appear to those skilled in the present art, will still fall within the spirit and scope of the present invention, as defined in the appended claims.

What is claimed is:

1. A thin film transistor array panel comprising:
   a gate line;
   a data line intersecting the gate line;
   a thin film transistor connected to the gate line and the data line;
   a pixel electrode separated from the thin film transistor and having a cutout;
   a direction control electrode connected to the thin film transistor and overlapping the cutout; and
   a coupling electrode connected to the direction control electrode and overlapping the pixel electrode,
   wherein the cutout extends along the direction control electrode and a width of the direction control electrode is smaller than that of the cutout.

2. The thin film transistor array panel of claim 1, further comprising a storage electrode that overlaps the coupling electrode.

3. The thin film transistor array panel of claim 1, wherein a voltage of the direction control electrode is higher than a voltage of the pixel electrode with respect to a predetermined voltage.

4. The thin film transistor array panel of claim 3, wherein the voltage of the pixel electrode is lower than 0.5 times the voltage of the direction control electrode.

5. The thin film transistor array panel of claim 4, wherein the voltage of the pixel electrode is 0.3 to 0.5 times the voltage of the direction control electrode.

6. The thin film transistor array panel of one of claim 2, wherein the cutout is oblique.

7. The thin film transistor array panel of claim 6, wherein the cutout has inversion symmetry with respect to the storage electrode.

8. The thin film transistor array panel of claim 2, wherein at least a part of portions of the coupling electrode overlapping the storage electrode overlaps the pixel electrode.

9. A liquid crystal display comprising:
   a gate line;
   a data line intersecting the gate line;
   a thin film transistor connected to the gate line and the data line;
   a coupling capacitor connected to the thin film transistor; and
   a liquid crystal capacitor connected to the coupling capacitor,
   wherein the coupling capacitor and the liquid crystal capacitor include a pixel electrode having a cutout in common, and the coupling capacitor includes a direction control electrode that overlaps the cutout,
   wherein the cutout extends along the direction control electrode and exposes the entire direction control electrode.

10. The liquid crystal display of claim 9, further comprising a storage capacitor connected to the thin film transistor in parallel with the coupling capacitor.

11. The liquid crystal display of claim 10, wherein the storage capacitor includes a coupling electrode that is connected to the direction control electrode.

12. The liquid crystal display of claim 9, wherein a voltage of the direction control electrode is higher than a voltage of the pixel electrode with respect to a predetermined voltage.

13. The liquid crystal display of claim 9, wherein a voltage of the pixel electrode is lower than 0.5 times a voltage of the direction control electrode.

14. The liquid crystal display of claim 9, wherein a voltage of the pixel electrode is 0.3 to 0.5 times a voltage of the direction control electrode.

15. A liquid crystal display comprising:
   a gate line;
   a data line intersecting-the gate line;
   a thin film transistor connected to the gate line and the data line;
   a pixel electrode separated from the thin film transistor and having a cutout;
   a direction control electrode connected to the thin film transistor and overlapping the cutout;
   a coupling electrode connected to the direction control electrode and overlapping the pixel electrode; and
   a common electrode facing the pixel electrode and the direction control electrode and having a continuous surface,
   wherein the cutout extends along the direction control electrode and exposes the entire direction control electrode.

16. The liquid crystal display of claim 15, further comprising a storage electrode overlapping the coupling electrode.

* * * * *